(12) United States Patent
Stewart et al.

(10) Patent No.: US 11,515,587 B2
(45) Date of Patent: Nov. 29, 2022

(54) PHYSICS-BASED CONTROL OF BATTERY TEMPERATURE

(71) Applicant: Robert Bosch GmbH, Stuttgart (DE)

(72) Inventors: Sarah Stewart, San Carlos, CA (US); John F. Christensen, Elk Grove, CA (US); Nikhil Ravi, Redwood City, CA (US); Maksim Subbotin, San Carlos, CA (US); Reinhardt Klein, Mountain View, CA (US); Yongfang Cheng, Mountain View, CA (US)

(73) Assignee: Robert Bosch GmbH, Stuttgart (DE)

(*) Notice: Subject to any disclaimer, the term of this patent is extended or adjusted under 35 U.S.C. 154(b) by 379 days.

(21) Appl. No.: 16/598,037

(22) Filed: Oct. 10, 2019

(65) Prior Publication Data
US 2021/0111446 A1    Apr. 15, 2021

(51) Int. Cl.
*H02J 7/00* (2006.01)
*H01M 10/44* (2006.01)
(Continued)

(52) U.S. Cl.
CPC ........ *H01M 10/633* (2015.04); *G01R 31/367* (2019.01); *H01M 10/443* (2013.01);
(Continued)

(58) Field of Classification Search
CPC ............. H01M 10/633; H01M 10/443; H01M 10/486; G01R 31/367; H02J 7/0021; H02J 7/0047; H02J 7/005
(Continued)

(56) References Cited

U.S. PATENT DOCUMENTS

| 5,307,000 A * | 4/1994 | Podrazhansky ....... H02J 7/0069 320/149 |
| 5,624,003 A * | 4/1997 | Matsuki .............. H01M 10/625 180/68.5 |

(Continued)

FOREIGN PATENT DOCUMENTS

| CN | 107145628 A | * | 9/2017 |
| CN | 107356879 A | * | 11/2017 |

(Continued)

OTHER PUBLICATIONS

Subramanian, V. R. et al., "Toward Real-Time Simulation of Physics Based Lithium-Ion Battery Models," Electrochemical and Solid-State Letters, vol. 10 (11), A255-A260, 2007 (6 pages).
(Continued)

*Primary Examiner* — John T Trischler
(74) *Attorney, Agent, or Firm* — Maginot, Moore & Beck LLP

(57) ABSTRACT

An electrochemical battery system includes at least one electrochemical cell, a thermal control system operably connected to the at least one electrochemical cell, a memory in which a physics-based model of the at least one electrochemical cell is stored and in which program instructions are stored, and a controller operably connected to the at least one electrochemical cell, the thermal control system and the memory. The controller is configured to execute the program instructions to identify a first requested operation, obtain a first generated target temperature which is based on the physics-based model and the identified first requested operation, and control the thermal control system based upon the obtained first target temperature while controlling the at least one electrochemical cell based upon the identified first requested operation.

18 Claims, 7 Drawing Sheets

(51) Int. Cl.
*G01R 31/367* (2019.01)
*H01M 10/633* (2014.01)
*H01M 10/48* (2006.01)

(52) U.S. Cl.
CPC ........... *H01M 10/486* (2013.01); *H02J 7/005* (2020.01); *H02J 7/0021* (2013.01); *H02J 7/0047* (2013.01)

(58) Field of Classification Search
USPC ........................................................ 320/137
See application file for complete search history.

(56) References Cited

U.S. PATENT DOCUMENTS

| | | | | |
|---|---|---|---|---|
| 5,694,023 | A * | 12/1997 | Podrazhansky | H02J 7/00711 320/132 |
| 5,795,664 | A * | 8/1998 | Kelly | H02J 7/00047 340/636.15 |
| 6,016,047 | A * | 1/2000 | Notten | H01M 10/48 320/137 |
| 6,737,831 | B2 * | 5/2004 | Champlin | H01M 10/48 320/132 |
| 7,564,221 | B2 * | 7/2009 | Asai | G01R 31/367 320/132 |
| 7,883,793 | B2 * | 2/2011 | Niedzwiecki | H01M 50/291 429/157 |
| 8,190,384 | B2 * | 5/2012 | Zhang | G01R 31/3842 702/63 |
| 8,281,268 | B2 * | 10/2012 | Yang | G06F 30/398 716/111 |
| 8,301,285 | B2 * | 10/2012 | Zhang | H01M 10/052 700/97 |
| 8,395,355 | B2 * | 3/2013 | Kaita | H02J 7/005 320/134 |
| 8,718,988 | B2 * | 5/2014 | Bohlen | G01R 31/367 703/4 |
| 8,729,904 | B2 * | 5/2014 | Yount | H01M 10/4207 324/434 |
| 8,883,333 | B2 * | 11/2014 | Krupadanam | H01M 8/04373 429/63 |
| 9,040,186 | B2 * | 5/2015 | Lev | H01M 10/482 429/90 |
| 9,130,248 | B2 | 9/2015 | Laskowsky | B60L 58/21 |
| 9,153,991 | B2 * | 10/2015 | Chaturvedi | H01M 10/443 |
| 9,197,089 | B2 | 11/2015 | Choe | H01M 10/48 |
| 9,377,512 | B2 | 6/2016 | Frost | B60L 50/66 |
| 9,379,392 | B2 | 6/2016 | Yan | H01M 10/625 |
| 9,431,849 | B2 | 8/2016 | Yan | H01M 10/63 |
| 9,448,083 | B2 | 9/2016 | Loftus | G01C 21/3682 |
| 9,553,465 | B2 | 1/2017 | Raghavan | H02J 7/0031 |
| 9,727,671 | B2 | 8/2017 | Iyengar | G06F 30/20 |
| 9,728,990 | B2 | 8/2017 | Dangler | H02J 7/0029 |
| 9,851,407 | B2 * | 12/2017 | Keating, I | H02J 7/007 |
| 9,878,631 | B2 | 1/2018 | Hyde | B60L 1/14 |
| 9,893,394 | B2 | 2/2018 | Shin | B60L 3/0046 |
| 9,921,272 | B2 | 3/2018 | Busser | H02J 7/00306 |
| 9,960,625 | B2 | 5/2018 | Klein | H01M 10/44 |
| 10,007,284 | B2 * | 6/2018 | Enyedy | H02J 7/00 |
| 10,074,996 | B2 | 9/2018 | Stefanopoulou | H01M 10/48 |
| 10,183,590 | B2 | 1/2019 | Juang | G06N 3/0454 |
| 10,224,579 | B2 | 3/2019 | Christensen | H02J 7/0091 |
| 10,243,385 | B2 | 3/2019 | MirTabatabaei | H01M 10/482 |
| 10,256,515 | B2 | 4/2019 | Basu | F28F 27/00 |
| 10,263,447 | B2 | 4/2019 | MirTabatabaei | H02J 7/0071 |
| 10,298,026 | B2 | 5/2019 | Trimboli | H02J 7/005 |
| 10,312,699 | B2 | 6/2019 | Subbaraman | G01R 31/374 |
| 10,330,731 | B2 | 6/2019 | Kuusisto | B60L 58/15 |
| 10,333,323 | B2 | 6/2019 | Arends | H02J 7/0068 |
| 10,354,026 | B2 | 7/2019 | Tate, Jr. | G06F 30/367 |
| 10,360,519 | B2 | 7/2019 | Mu | G06Q 10/04 |
| 10,447,046 | B2 * | 10/2019 | Ravi | G06F 1/28 |
| 10,447,054 | B2 * | 10/2019 | Christensen | H01M 10/425 |
| 10,471,847 | B1 | 11/2019 | Han | B60W 20/00 |
| 10,481,623 | B1 * | 11/2019 | Forouzan | H01M 10/66 |
| 10,491,022 | B2 | 11/2019 | MirTabatabaei | H01M 10/482 |
| 10,539,621 | B2 * | 1/2020 | Chow | G01R 31/3646 |
| 10,547,184 | B2 * | 1/2020 | Carralero | H02J 7/0029 |
| 10,596,912 | B2 * | 3/2020 | Sakakibara | B60L 58/27 |
| 10,686,321 | B2 * | 6/2020 | Ravi | H01M 10/425 |
| 10,705,152 | B1 * | 7/2020 | Weiss | G01R 31/3828 |
| 10,829,004 | B1 * | 11/2020 | Han | H02J 7/00716 |
| 10,886,575 | B2 * | 1/2021 | Christensen | G01R 31/367 |
| 10,953,726 | B2 * | 3/2021 | Carlson | B60H 1/00278 |
| 10,985,588 | B2 * | 4/2021 | MirTabatabaei | G01R 31/382 |
| 11,014,466 | B2 * | 5/2021 | Sinha | B60L 53/62 |
| 11,072,246 | B2 * | 7/2021 | Murbach | G01R 31/392 |
| 11,104,235 | B2 * | 8/2021 | Suzuki | G06Q 30/0645 |
| 11,125,825 | B2 * | 9/2021 | Cha | H01M 10/486 |
| 11,125,827 | B2 * | 9/2021 | Wild | G01R 31/392 |
| 11,152,653 | B2 * | 10/2021 | Carlson | H01M 10/613 |
| 11,283,116 | B2 * | 3/2022 | Liu | H01M 10/625 |
| 11,313,912 | B2 * | 4/2022 | Hong | H01M 10/42 |
| 2002/0000788 | A1 * | 1/2002 | Ostergaard | H02J 7/00036 320/128 |
| 2002/0109504 | A1 * | 8/2002 | Champlin | G01R 31/389 324/426 |
| 2002/0120906 | A1 * | 8/2002 | Xia | H01M 8/04992 716/111 |
| 2005/0110498 | A1 * | 5/2005 | Plett | G01R 31/3828 324/433 |
| 2006/0142932 | A1 * | 6/2006 | Yasui | F01L 1/352 374/E7.042 |
| 2007/0003831 | A1 * | 1/2007 | Fripp | H01M 50/24 429/50 |
| 2007/0145953 | A1 * | 6/2007 | Asai | G01R 31/367 320/149 |
| 2010/0019729 | A1 * | 1/2010 | Kaita | H02J 5/00 320/134 |
| 2010/0090650 | A1 * | 4/2010 | Yazami | H02J 7/007 320/132 |
| 2010/0148731 | A1 * | 6/2010 | Notten | H01M 10/443 320/162 |
| 2010/0174500 | A1 * | 7/2010 | Plett | G01R 31/3828 324/427 |
| 2010/0243017 | A1 * | 9/2010 | Normann | H01M 10/6561 429/62 |
| 2011/0012558 | A1 * | 1/2011 | Schaffnit | B60L 58/10 320/116 |
| 2011/0221446 | A1 * | 9/2011 | Yount | H01M 10/486 324/434 |
| 2012/0041698 | A1 * | 2/2012 | Zhang | G01R 31/3842 702/63 |
| 2012/0046776 | A1 * | 2/2012 | Zhang | H01M 10/052 700/106 |
| 2012/0101755 | A1 * | 4/2012 | Hirasawa | H01M 10/48 702/63 |
| 2012/0215517 | A1 * | 8/2012 | Bohlen | G01R 31/3647 703/18 |
| 2012/0295142 | A1 * | 11/2012 | Yan | H01M 10/486 429/62 |
| 2012/0306446 | A1 * | 12/2012 | Suganuma | B60L 53/63 701/119 |
| 2013/0093393 | A1 * | 4/2013 | Shimotani | G06Q 10/04 320/109 |
| 2013/0106366 | A1 * | 5/2013 | Fripp | H01M 10/0525 320/141 |
| 2013/0119921 | A1 * | 5/2013 | Choe | H01M 10/44 320/106 |
| 2013/0119942 | A1 * | 5/2013 | Sutarwala | H02J 7/0047 320/137 |
| 2013/0149573 | A1 * | 6/2013 | Krupadanam | H01M 8/04597 429/63 |
| 2013/0209846 | A1 * | 8/2013 | Lev | H01M 10/486 429/90 |
| 2013/0317771 | A1 * | 11/2013 | Laskowsky | B60L 58/12 702/63 |
| 2013/0337348 | A1 * | 12/2013 | Zheng | H01M 4/8605 429/405 |
| 2014/0002031 | A1 * | 1/2014 | Chaturvedi | H01M 10/443 320/152 |

(56) References Cited

U.S. PATENT DOCUMENTS

| | | | | |
|---|---|---|---|---|
| 2014/0039735 A1* | 2/2014 | Major | | B60L 53/64 320/155 |
| 2014/0067344 A1* | 3/2014 | Kawai | | H01M 10/482 703/2 |
| 2014/0072835 A1* | 3/2014 | Tsujimura | | H01M 10/6562 429/7 |
| 2014/0114595 A1* | 4/2014 | Wickert | | G01R 31/367 702/63 |
| 2014/0121866 A1* | 5/2014 | Dangler | | B60L 58/24 701/22 |
| 2014/0125348 A1* | 5/2014 | Ben-Aicha | | H02J 7/0047 324/430 |
| 2014/0333317 A1* | 11/2014 | Frost | | G01R 31/382 324/430 |
| 2014/0375277 A1* | 12/2014 | Yan | | H02J 7/007192 320/150 |
| 2015/0151642 A1* | 6/2015 | Suzuki | | G08G 1/00 705/5 |
| 2015/0241233 A1* | 8/2015 | Loftus | | G01C 21/3469 701/410 |
| 2015/0280294 A1* | 10/2015 | Shin | | B60L 3/12 429/50 |
| 2015/0303723 A1* | 10/2015 | Raghavan | | G01N 21/7703 320/107 |
| 2015/0316618 A1* | 11/2015 | Lou | | G01R 31/367 702/63 |
| 2015/0318589 A1* | 11/2015 | Keating, I | | H02J 7/0013 219/209 |
| 2015/0321570 A1* | 11/2015 | Cun | | G06Q 10/06312 320/109 |
| 2015/0326038 A1* | 11/2015 | Lee | | H02J 7/00302 320/134 |
| 2015/0340744 A1* | 11/2015 | Knobloch | | H01M 10/48 429/61 |
| 2016/0064972 A1* | 3/2016 | Stefanopoulou | | H01M 10/48 320/116 |
| 2016/0098051 A1* | 4/2016 | Enyedy | | H02J 7/2437 307/52 |
| 2016/0105041 A1* | 4/2016 | Henderson | | H02J 7/007184 320/162 |
| 2016/0131714 A1* | 5/2016 | Kuusisto | | G01R 31/382 702/63 |
| 2016/0241058 A1* | 8/2016 | Carralero | | H02J 7/0021 |
| 2016/0253440 A1* | 9/2016 | Iyengar | | G06F 30/20 703/2 |
| 2016/0285289 A1* | 9/2016 | Arends | | H02J 7/342 |
| 2016/0336765 A1* | 11/2016 | Trimboli | | H02J 7/00 |
| 2016/0359339 A1* | 12/2016 | Hwang | | H02J 7/0077 |
| 2017/0033417 A1* | 2/2017 | Basu | | F28F 27/00 |
| 2017/0187202 A1* | 6/2017 | Shin | | H02J 7/00309 |
| 2017/0194669 A1* | 7/2017 | Christensen | | G01R 31/367 |
| 2017/0215664 A1* | 8/2017 | Conrad | | A47L 9/2884 |
| 2017/0222447 A1* | 8/2017 | Ravi | | H02J 7/0071 |
| 2017/0222448 A1* | 8/2017 | MirTabatabaei | | H01M 10/482 |
| 2017/0222449 A1* | 8/2017 | MirTabatabaei | | H01M 10/425 |
| 2017/0229878 A1* | 8/2017 | Kim | | H02J 7/007 |
| 2017/0235858 A1* | 8/2017 | Tate, Jr. | | G06F 30/20 703/2 |
| 2017/0288414 A1* | 10/2017 | Klein | | H01M 10/425 |
| 2017/0338666 A1* | 11/2017 | Christensen | | G01R 31/392 |
| 2018/0043778 A1* | 2/2018 | Murbach | | G01R 31/392 |
| 2018/0083461 A1* | 3/2018 | Ravi | | G06F 1/30 |
| 2018/0086222 A1* | 3/2018 | Juang | | H02J 7/007182 |
| 2018/0095141 A1* | 4/2018 | Wild | | H01M 10/052 |
| 2018/0241229 A1* | 8/2018 | Kitaoka | | B60L 53/65 |
| 2018/0292465 A1* | 10/2018 | Osara | | G01M 5/0033 |
| 2018/0312072 A1* | 11/2018 | Yang | | B60L 53/305 |
| 2018/0331404 A1* | 11/2018 | Slama | | H01M 10/63 |
| 2018/0345816 A1* | 12/2018 | Sakakibara | | B60L 53/14 |
| 2019/0036356 A1* | 1/2019 | Subbaraman | | H02J 7/0021 |
| 2019/0041464 A1* | 2/2019 | Chow | | G01R 31/3646 |
| 2019/0089018 A1* | 3/2019 | Christensen | | G01R 31/367 |
| 2019/0089023 A1* | 3/2019 | Sastry | | H01M 10/0562 |
| 2019/0109465 A1* | 4/2019 | MirTabatabaei | | H01M 10/48 |
| 2019/0109466 A1* | 4/2019 | MirTabatabaei | | H02J 7/0013 |
| 2019/0157882 A1* | 5/2019 | Sherback | | B60L 53/11 |
| 2019/0178951 A1* | 6/2019 | Cha | | G01R 19/16542 |
| 2019/0299942 A1* | 10/2019 | Shih | | H02J 9/06 |
| 2019/0319223 A1* | 10/2019 | Watanabe | | H01M 50/10 |
| 2019/0372179 A1* | 12/2019 | Singer | | B60L 58/16 |
| 2019/0384876 A1* | 12/2019 | Tate, Jr. | | G06F 30/20 |
| 2020/0055406 A1* | 2/2020 | Vallender | | H01M 10/615 |
| 2020/0136173 A1* | 4/2020 | Hong | | H01M 10/44 |
| 2020/0150185 A1* | 5/2020 | Ramezan | | H01M 10/425 |
| 2020/0180465 A1* | 6/2020 | Watson | | H02J 7/00712 |
| 2020/0285962 A1* | 9/2020 | Garcia Satorras | | G05B 13/04 |
| 2020/0313152 A1* | 10/2020 | Stefanopoulou | | G01R 31/3842 |
| 2020/0338959 A1* | 10/2020 | Carlson | | H01M 10/635 |
| 2020/0343601 A1* | 10/2020 | Carlson | | H01M 10/486 |
| 2020/0363475 A1* | 11/2020 | Han | | G01R 31/382 |
| 2020/0376927 A1* | 12/2020 | Rajaie | | B60H 1/00885 |
| 2020/0386822 A1* | 12/2020 | Weiss | | G01R 31/367 |
| 2021/0025942 A1* | 1/2021 | Rahimian | | G01R 31/385 |
| 2021/0036388 A1* | 2/2021 | Liu | | H01M 10/615 |
| 2021/0041241 A1* | 2/2021 | Mitra | | G05B 13/042 |
| 2021/0048480 A1* | 2/2021 | Lim | | G01R 31/3842 |
| 2021/0057919 A1* | 2/2021 | Subbotin | | H01M 10/44 |
| 2021/0173012 A1* | 6/2021 | Subbotin | | G01R 31/367 |
| 2021/0231739 A1* | 7/2021 | Hong | | H01M 10/488 |
| 2021/0288353 A1* | 9/2021 | Gottapu | | H01M 10/425 |
| 2021/0305815 A1* | 9/2021 | Ogawa | | B60L 53/14 |
| 2021/0319152 A1* | 10/2021 | Couture | | G06Q 50/06 |
| 2021/0320343 A1* | 10/2021 | Flannery | | H01M 10/0525 |
| 2021/0336464 A1* | 10/2021 | Fritz | | H02J 7/0068 |
| 2021/0349155 A1* | 11/2021 | Srinivasan | | H01M 10/486 |
| 2021/0349157 A1* | 11/2021 | Srinivasan | | G01R 31/374 |
| 2021/0384559 A1* | 12/2021 | Zhao | | H01M 10/486 |
| 2022/0009367 A1* | 1/2022 | Lee | | H01M 10/625 |
| 2022/0074995 A1* | 3/2022 | Bharathraj | | G01R 31/367 |
| 2022/0111739 A1* | 4/2022 | Sugimoto | | H02J 7/007 |

FOREIGN PATENT DOCUMENTS

| | | | | |
|---|---|---|---|---|
| CN | 107356879 B | * | 9/2019 | |
| CN | 110427639 A | * | 11/2019 | |
| CN | 111025172 A | * | 4/2020 | |
| CN | 111595485 A | * | 8/2020 | |
| CN | 107145628 B | * | 9/2020 | |
| EP | 2107625 A1 | * | 10/2009 | H01M 10/06 |
| EP | E P-2293091 A2 | * | 3/2011 | H01M 10/48 |

OTHER PUBLICATIONS

Namor, E. et al., "Battery Storage System Optimal Exploitation Through Physics-Based Model Predictive Control," 2017 (6 pages).

M. Doyle, T. F. Fuller, J. Newman, "Modeling of galvanostatic charge and discharge of the lithium/polymer/insertion cell", J. Electrochem. Soc., vol. 140, No. 6, pp. 1526-1533, (1993).

Chaturverdi et al., "Algorithms for Advanced Battery-Management Systems," IEEE Control Systems Magazine, vol. 30, Issue: 3 (2010).

\* cited by examiner

PHYSICS-BASED CONTROL OF BATTERY TEMPERATURE

FIELD

This disclosure relates generally to batteries and, more specifically, to methods for controlling lithium-ion batteries.

BACKGROUND

There is an increasing trend towards the electrification of the automobile, and most car manufacturers have announced plans to produce plug-in hybrid electric vehicles (PHEV) and electric vehicles (EV). Currently, Li-ion based batteries are believed to be the most promising battery system for hybrid electric vehicle (HEV), PHEV, and EV applications due to their high energy density, lack of hysteresis and low self-discharge currents.

Some technical challenges, however, remain in integrating Li-ion based batteries into vehicular settings. One technical challenge is the time needed to recharge the battery pack. While fast-charging is desired for user convenience, formidable challenges arise in fast charging of Li-ion batteries where standard charging techniques such as constant current-constant voltage (CC-CV), if used for fast charging, can result in damage to the battery due to the large currents passed through the battery. These large currents result in overpotentials and mechanical stress in the battery that can accelerate the aging process of the battery and result in reduced lifetime.

Another important aspect is that the power demanded from a battery varies dramatically while in use. For example, demands during acceleration and while driving up inclines typically exceed power demands of the vehicle while cruising or driving down declines.

In an effort to optimally operate batteries under these changing conditions, advanced battery management systems (BMS) have been incorporated into vehicles. The BMS is configured to provide adequate charging strategies for refueling the battery pack in a fast and reliable manner. The BMS is also used to regulate power output and consumption. The incorporation of a BMS is complicated, however, because the above conditions are not the only variables that must be dealt with.

For example, the performance of a lithium-ion battery degrades with use and time. Energy and power storage capabilities decrease due to a variety of mechanisms including (but not limited to) 1) loss of available lithium, 2) loss of electrode host material, and/or 3) an increase in cell internal resistance. Lithium can be lost in the solid-electrolyte interphase (SEI), or through lithium deposits (e.g. dendrites). Electrode host material may degrade with time as well. For example, manganese oxide material can experience manganese dissolution. Accordingly, the physics of the particular cell changes over the lifetime of the cell.

The physics changes in a cell are not, however, linear over time for each cell. Warming a battery affects the rate of these degradation mechanisms. By way of example, at increased temperatures the rate of side reactions, which prematurely age the cell by producing capacity fade and increased internal resistance, increases. High-energy cells, such as those incorporating lithium, may be more sensitive to temperature effects due to higher electrode loading, less electrode porosity, and smaller amounts of electrolyte. Reduced electrolyte results because as a cell cycles and materials expand/contract, electrolyte may be squeezed out from the cell electrodes.

Higher temperature is not, however, purely detrimental to a battery. Thus, while higher temperatures increase the rate of SEI growth, higher temperature can also decrease the risk of dendrite formation. Moreover, increasing cell temperature can accelerate diffusion of the electrolyte back into the cell electrodes. Increased temperature also accelerates diffusion of ions between electrodes, and transport/kinetics as lithium ions intercalate/deintercalate. Thus, the internal resistance of a lithium-ion battery typically decreases with increasing temperature (within a specified operating range), thereby increasing battery power and energy density. Additionally, with decreased internal resistance less voltage is required as a driving force (resistance is lower) during charging. Accordingly, for a given voltage, the rate of charge is increased.

Consequently, upper temperature limits associated with cells, particularly lithium-ion cells, are typically set at a temperature which balances excessive aging with the benefits of warmer temperature. The temperature limits, however, are based upon a nominal cell rather than on the particular physics of a particular cell at a particular time. Accordingly, the temperature limits are typically overly conservative so as to protect non-nominal cells. Moreover, some temperature limits are established without regard to the actual age of the cell.

The inadequacy of simply using nominal cell data is illustrated by reference to the rate of deleterious side reactions. The rate of side reactions, while, related to temperature, are also related to the state of charge (SOC) of a cell. As the SOC of a cell increases for a given temperature, the rate of side reactions for a given time of life increases. Accordingly, a single temperature limit unnecessarily restricts the operation of a battery both during charging events and during discharging events.

Moreover, in addition to cell-focused considerations, practical system (e.g., vehicular) embodiments must further allow for operational requirements. For example, a user who infrequently undertakes trips requiring a recharge during the trip may determine that the convenience of a fast charge so as to continue on a particular trip outweighs the cost of increased aging of a battery from a fast charge since such fast charging is rarely used. Thus, the loss of battery life is offset by the convenience of the faster charge.

Accordingly, a BMS which better balances the operational requirements demanded of the battery while minimizing, e.g., aging effects of the battery would be beneficial. It would be further beneficial if the user of the system could influence the manner in which the BMS controlled battery operation to account for operational desires of the user for the overall system.

SUMMARY

In one embodiment, an electrochemical battery system includes at least one electrochemical cell, a thermal control system operably connected to the at least one electrochemical cell, a memory in which a physics-based model of the at least one electrochemical cell is stored and in which program instructions are stored, and a controller operably connected to the at least one electrochemical cell, the thermal control system and the memory. The controller is configured to execute the program instructions to identify a first requested operation, obtain a first generated target temperature which is based on the physics-based model and the identified first requested operation, and control the thermal control system based upon the obtained first target temperature while controlling the at least one electrochemical cell based upon the identified first requested operation.

In one or more embodiments, obtaining the first generated target temperature based on the physics-based model and the identified first requested operation includes obtaining at least one cell first parameter of the at least one cell using a sensor suite associated with the at least one cell. The system then sets a model target temperature to a predetermined temperature associated with the first requested operation and sets a model target current to a maximum current associated with the first requested operation. The physics-based model is then used to predict a first future at least one cell second parameter of the at least one cell based upon the obtained at least one cell first parameter using the model target temperature, and the model target current. The predicted first future at least one cell second parameter is then compared to a threshold and, if satisfactory, the model target temperature and current are set as generated target temperature and current for use in controlling the cell.

In one or more embodiments, the controller is further configured to execute the program instructions to identify any additional requested operations which are different from the first requested operation. The system then obtains a different generated target temperature based on the physics-based model and the identified second requested operation, and controls the thermal control system based upon the different generated target temperature while controlling the at least one electrochemical cell based upon the identified second requested operation.

In one or more embodiments, the controller receives itinerary data from a user input/output device, identifies a required charging operation based upon the itinerary data, and sets the required charging operation as the requested operation.

In one or more embodiments, the controller further identifies the required charging operation as a fast charging operation and alerts the user to this fact using an input/output device. The user is then required to authorize the controller to perform a fast charge through the input/output device.

In one or more embodiments, the controller obtains mileage data associated with the itinerary data from a trip associated database. By providing itinerary data including a trip start time, the controller identifies the first required charging operation as a fast charging based upon the obtained mileage data and the trip start time.

In one or more embodiments, obtaining the first generated target temperature based on the physics-based model and the identified requested operation includes generating a modified model target temperature based upon the model target temperature, generating a modified model target current based upon the model target current, predicting a second future at least one cell second parameter of the at least one cell based upon the obtained at least one cell first parameter using the physics-based model, the modified model target temperature, and the modified model target current, setting the model target temperature to the modified model target temperature, setting the model target current to the modified model target current, and comparing the second future at least one cell second parameter to a second threshold. If the comparison criterion/criteria is/are satisfied, the model target temperature/current are used as the generated target temperature and current. Otherwise, the above steps are repeated.

In accordance with one embodiment, a method of operating an electrochemical battery system includes identifying with a controller operably connected to at least one electrochemical cell, a thermal control system, and a memory, a first requested operation by executing program instructions stored in the memory. The method further includes obtaining with the controller a first generated target temperature, the first generated target temperature based on a physics-based model stored in the memory and the identified first requested operation. Then the controller controls the thermal control system based upon the obtained first target temperature while controlling the at least one electrochemical cell with the controller based upon the identified first requested operation.

In one or more embodiments, obtaining the first generated target temperature includes obtaining at least one cell first parameter of the at least one cell using a sensor suite associated with the at least one cell. The controller then sets a model target temperature to a predetermined temperature associated with the first requested operation and a model target current to a maximum current associated with the first requested operation. The method includes predicting a first future at least one cell second parameter of the at least one cell based upon the obtained at least one cell first parameter using the physics-based model, the model target temperature, and the model target current, and comparing with the controller the first future at least one cell second parameter to a first threshold.

In one or more embodiments the method further includes identifying with the controller a second requested operation, the second requested operation different from the first requested operation, obtaining with the controller a second generated target temperature, the second generated target temperature based on the physics-based model and the identified second requested operation, the second generated target temperature different from the first generated target temperature, and controlling with the controller the thermal control system based upon the obtained second generated target temperature while controlling the at least one electrochemical cell based upon the identified second requested operation.

In one or more embodiments, the method includes receiving with the controller at least one itinerary data from a user input/output device, identifying with the controller a first required charging operation based upon the at least one itinerary data, and setting the first required charging operation as the first requested operation.

In one or more embodiments, the method includes identifying with the controller the first required charging operation as a fast charging operation, controlling the user input/output device to alert the user that the fast charging operation is required based upon identifying the first required charging operation as the fast charging operation, and receiving with the controller authorization from the user to perform the fast charge through the input/output device.

In one or more embodiments, the at least one itinerary data includes a trip start time and the method further includes obtaining with the controller mileage data associated with the at least one itinerary data from at least one trip associated database. In this method, identifying with the controller the first required charging operation as the fast charging operation includes using the obtained mileage data and the trip start time to identify the first required charging operation as the fast charging operation.

In one or more embodiments, obtaining the first generated target temperature further includes generating a modified model target temperature based upon the model target temperature and generating a modified model target current based upon the model target current. A second future at least one cell second parameter of the at least one cell is then predicted based upon the obtained at least one cell first parameter using the physics-based model, the modified model target temperature, and the modified model target current. The method includes setting the model target temperature to the modified model target temperature, setting the model target current to the modified model target current, and comparing the second future at least one cell second parameter to a second threshold.

BRIEF DESCRIPTION OF THE DRAWINGS

FIG. 3 is a schematic view of a battery cell of the battery pack of FIG. 1.

DETAILED DESCRIPTION

For the purposes of promoting an understanding of the principles of the embodiments described herein, reference is now be made to the drawings and descriptions in the following written specification. No limitation to the scope of the subject matter is intended by the references. This disclosure also includes any alterations and modifications to the illustrated embodiments and includes further applications of the principles of the described embodiments as would normally occur to one skilled in the art to which this document pertains.

Various operations may be described as multiple discrete actions or operations in turn, in a manner that is most helpful in understanding the claimed subject matter. However, the order of description should not be construed as to imply that these operations are necessarily order dependent. In particular, these operations in some embodiments are performed in a different order than the described embodiment. Various additional operations are performed and/or described operations are omitted in additional embodiments.

The terms "comprising," "including," "having," and the like, as used with respect to embodiments of the disclosure, are synonymous. As used herein, the word "about" when modifying a number means at least within ten percent of the stated number, preferably within five percent of the stated number, and most preferably within two percent of the stated number.

The embodiments of the disclosure discussed below are applicable to any desired battery chemistry which exhibits temperature related variation in internal resistance and/or temperature related differences in internal aging processes.

Some examples refer to lithium-ion batteries for illustrative purposes. As used herein, the term "lithium-ion battery" refers to any battery which includes lithium as an active material. In particular, lithium-ion batteries include, without limitation, lithium based liquid electrolytes, solid electrolytes, gel electrolytes, and batteries commonly referred to as lithium-polymer batteries or lithium-ion-polymer batteries. As used herein, the term "gel electrolyte" refers to a polymer infused with a liquid electrolyte.

Moreover, while described with respect to a vehicular embodiment, the disclosure is applicable to any usage of a battery in an operational setting wherein it is desired to balance operational requirements with loss of battery life.

Figure 1:
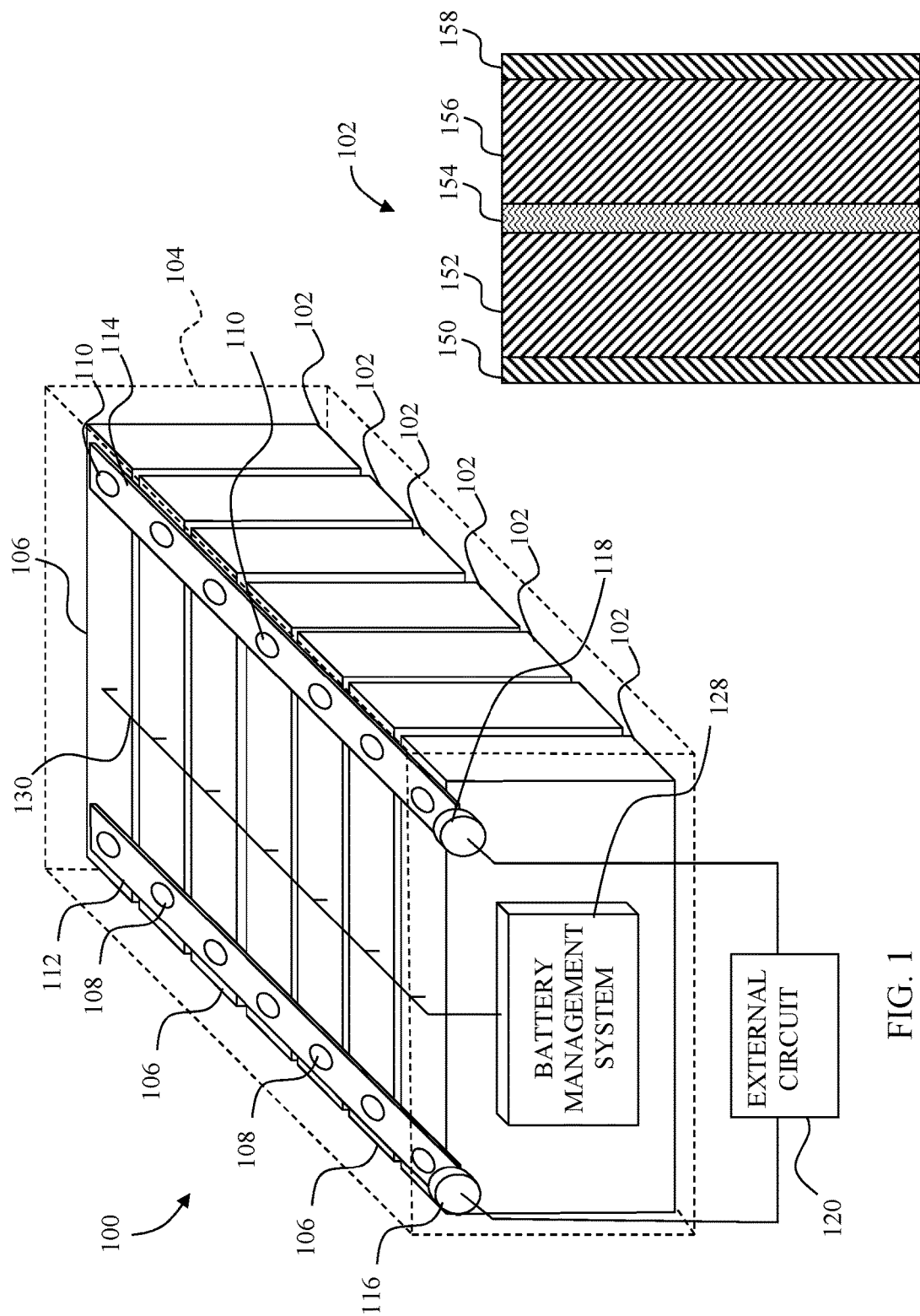
FIG. 1 is a schematic view of a battery pack according to the disclosure.

Referring now to FIG. 1, a battery pack 100 includes a plurality of battery cells 102 arranged in a pack housing 104. Each of the battery cells 102 includes a cell housing 106, from which a positive terminal 108 and a negative terminal 110 are exposed. In one embodiment of a parallel arrangement, the positive terminals 108 are connected to one another by a current collector 112, and the negative terminals 110 are connected to one another by a different current collector 114. In another embodiment, one or more of the positive terminals 108 are connected to adjacent negative terminals 110 by a current collector to provide a series connection. The current collectors 112/114 are connected to respective positive and negative battery pack terminals 116 and 118, which connect to an external circuit 120.

The external circuit 120 in one embodiment includes the electrical system of a vehicle in which the battery pack is located. The vehicular electrical system includes typical loads such as a motor, lights, navigation system, vehicular information and entertainment system, etc. Additionally, the external circuit provides for charging of the battery pack 100. To this end the motor in some embodiments is configured as a regenerative braking system. The external circuit 120 in some embodiments additionally/alternatively includes an external charging connection.

In the embodiment of FIG. 1, the battery pack 100 includes a battery management system (BMS) 128. The BMS 128 is operably connected to each of the battery cells 102 by a control line 130. The BMS 128 is described in further detail with reference to FIG. 2 which shows the BMS 128 incorporated into a system 132 which in some embodiments is an automobile. The BMS 128 includes a controller 134, a memory 136, and a communication module 138. The controller 134 is implemented in various embodiments with general or specialized programmable processors that execute programmed instructions which are stored in the memory 136. In some embodiments at least some of the functionality of the controller 134 is provided additionally/alternatively by a vehicular control system 142 and/or remotely from the system 132 such as by a remote controller located at a charging station, a service center, a manufacturing center, etc. Thus, in some embodiments, the controller 134 is embodied as multiple controllers which are located at the battery and/or remotely from the battery 102 and/or the system 132.

The instructions/commands and data required to perform the programmed functions are stored in the memory 136 along with a physics-based model of the battery pack 100 and/or cell 102. In some embodiments, the memory 136 is embodied as a plurality of memories which in some embodiments include one or more memories remote from the BMS 128. The processors, the memory, and communication module 138 or other interface circuitry configure the controller 134 to operate the battery pack 100 to charge and discharge the battery at a desired charge and discharge rate. The processors, the memory, and interface circuitry components in various embodiments are provided on a printed circuit card or provided as a circuit in an application specific integrated circuit (ASIC). In some embodiments, the circuits are implemented with discrete components or circuits provided in VLSI circuits. The circuits described herein are also implemented with a combination of processors, ASICs, discrete components, or VLSI circuits. Further discussion of a BMS can be found, for example, in U.S. Pat. No. 8,188,715 which issued May 29, 2012, the contents of which are hereby incorporated by reference in their entirety.

In addition to the battery cells 102, the controller 134 is operably connected to a sensor suite 140. The sensor suite 140 includes various sensors which are used to ascertain operating conditions of the battery cells 102. In one embodiment, one or more of the sensors is a temperature sensor, a voltage sensor, a pressure sensor, and/or a current/coulomb sensor. In some embodiments, each battery cell 102 is associated with a respective dedicated sensor suite 140 which is operably connected to the battery cell 102. The sensor suites 140 in these embodiments include one or more temperature sensors, voltage sensors, and/or current/coulomb sensors which is/are configured to obtain data for each individual cell.

Figure 2:
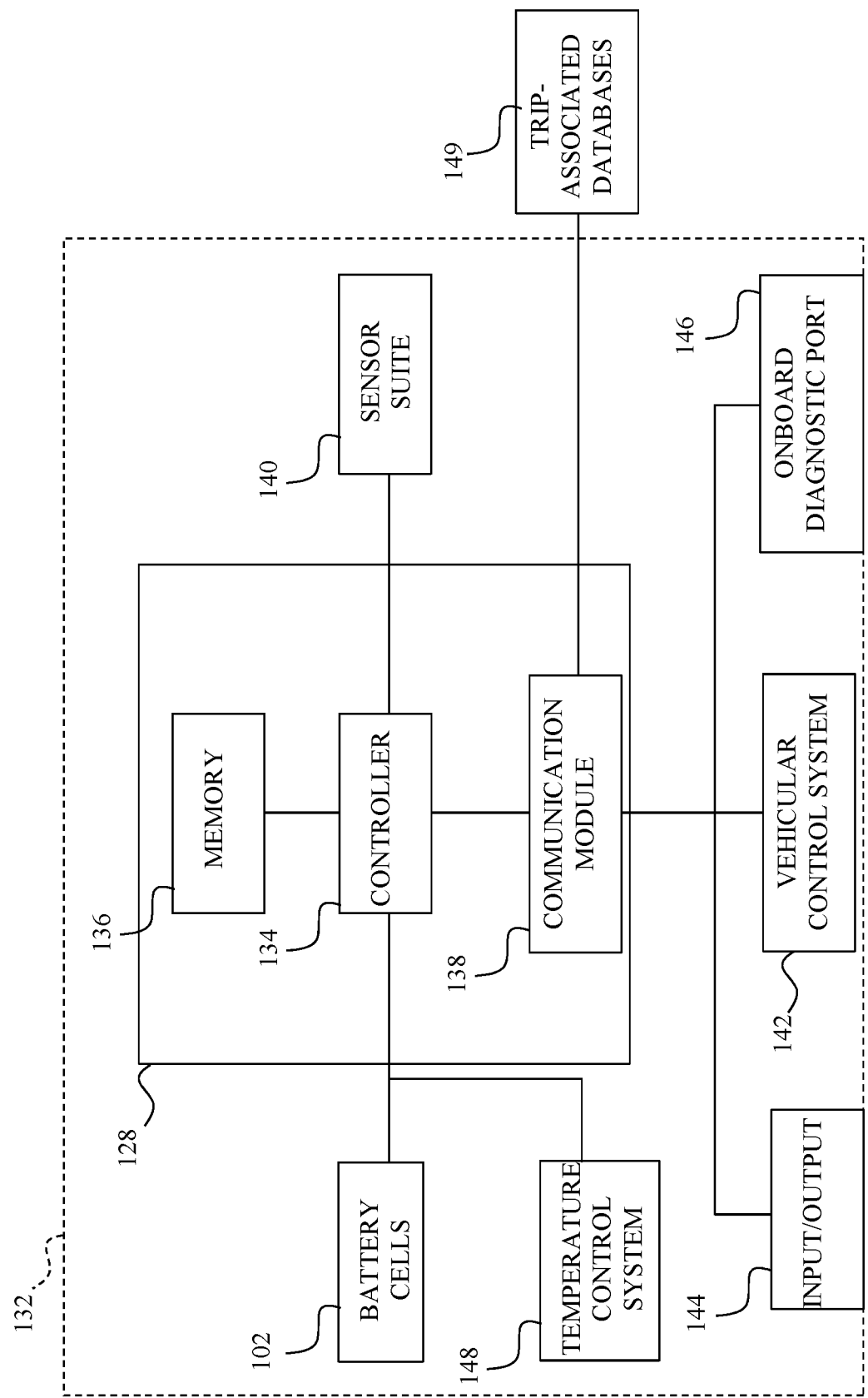
FIG. 2 is a schematic view of a system including a battery management system which controls the battery pack of FIG. 1.

The controller 134 in the embodiment of FIG. 2 is further operably connected through the communication module 138 to the vehicular control system 142, an input/output device 144 which in one embodiment includes a touchscreen, and an onboard diagnostic port 146. The communication module 138 in various embodiments is configured to wirelessly communicate with or through one or more of the vehicular control system 142, the input/output device 144, and the onboard diagnostic port 146.

The controller 134 is further operably connected to a temperature control system 148. The temperature control system 148 in different embodiments includes one or more of a fan, a vehicle cooling system, a heater, and the like. In some embodiments a liquid coolant is circulated through pipes positioned near the cells to heat/cool the cells. In some embodiments air is used to heat/cool cells with or without pipes. The temperature control system 148 is configured to provide heating and/or cooling to the battery pack 100 and/or cells 102 under control of the controller 134 so as to achieve a target cell temperature.

The controller 124 is further operably connected to trip-associated databases 149. While depicted in FIG. 2 as remote from the system 132, the trip-associated databases 149 in some embodiments are located, at least in part, within the memory 136. The trip-associated databases include data associated with travel. Accordingly, in one or more embodiments the trip-associated databases 149 include road maps, elevation data, weather data, traffic data, etc.

As shown in FIG. 3, each battery cell 102 in one embodiment includes a positive electrode current collector 150, a positive electrode layer 152, and a separator layer 154 which is omitted in some embodiments, a negative electrode 156, and a negative electrode current collector 158. In some embodiments, multiple layers of the battery cell 102 are stacked on top of one another so as to form an electrode stack. In other embodiments, the battery cell 102 is wound around itself in a spiral shape so as to form what is known as a "jelly-roll" or "Swiss-roll" configuration. In some embodiments, additional layers, e.g., protective layers, are provided The positive electrode current collector 150 electrically connects the positive terminal 108 of the battery cell 102 with the positive electrode 152 so as to enable flow of electrons between the external circuit 120 and the positive electrode 152. Likewise, the negative electrode current collector 158 electrically connects the negative terminals 110 with the negative electrode layer 156.

When the battery pack 100 is connected to the external circuit 120 that is powered by the battery pack 100, lithium ions are separated from electrons in the negative electrode 156. The lithium ions travel through the separator 154 and into the positive electrode 152. The free electrons in the battery pack 100 flow from the negative electrode 156, through the negative electrode current collector 158, to the negative terminals 110 of the battery cells 102. The electrons are then collected by the battery pack current collector 114 and transported to the battery pack terminal 118. The electrons flow through the external circuit 120 so as to provide electrical power and then pass through the positive battery pack terminal 116, and back into the battery cells 102 via the positive terminals 108. Connecting the battery pack 100 to an external circuit that charges the battery pack 100 results in the opposite flows of electrons and lithium ions.

As noted above, within the memory 136 a physics-based model is stored. In embodiments including multiple memories 136, a simplified physics-based model is stored within the local memory 136 of the BMS 128 while a more comprehensive physics-based model is stored in a memory 136 remote from the BMS 128 such as in the vehicular control system 142, a service facility, a manufacturer's facility, etc. Any desired physics-based model can be incorporated. Such physics-based models include those described by M Doyle, T. F. Fuller, J. Newman, "Modeling of galvanostatic charge and discharge of the lithium/polymer/insertion cell", J. Electrochem. Soc., vol. 140, no. 6, pp. 1526-1533, (1993), T. F. Fuller, M Doyle, J. Newman, "Simulation and optimization of the dual lithium ion insertion cell", J. Electrochem. Soc., vol. 141, pp. 1-10, 1994, and Chaturverdi et al., "Algorithms for Advanced Battery-Management Systems," IEEE Control Systems Magazine, Volume: 30, Issue: 3 (2010), and Subramanian et al., "Toward Real-Time Simulation of Physics Based Lithium Battery Models", Electrochemical and Solid State Letters, 10(11) A255-A269 (2007). A physics-based model is also disclosed in U.S. Pat. No. 9,153,991 which issued Oct. 6, 2015, the contents of which are hereby incorporated by reference in their entirety. The physics-based model provides a near real-time insight into the conditions within particular cells during battery operation.

Also stored within the memory 136 is side reaction loss rate limit data. The side reaction loss rate limit data, which in some embodiments is included in the physics-based model, identifies, for each defined cell operation, a limit associated with the rate of side reaction losses which is permitted. In some embodiments, one or more side loss rate limit data is expressed as an associated operational limit. By way of example, typically during a "fast charge", a cell is initially charged at a high current over a period of time during which the voltage of the cell varies. Once the cell reaches a particular voltage, the current is reduced and the cell is charged at a constant voltage through the end of the charge. In some embodiments, multiple constant voltage segments are used during a charge, each with a different voltage. During segments wherein the voltage is maintained constant, the current varies. The initial constant current and varying voltage applied to a cell during a fast charge is defined based upon a desired maximum side loss rate and is thus side reaction loss rate limit data. The initial constant current and varying voltage is also referred to as a "cell operation".

Likewise, each segment during the constant voltage segments of the fast charge (wherein voltage is held constant as current is allowed to vary) is a different "cell operation". Thus, a "cell operation" includes a predefined current and voltage relationship (or predefined current/voltage range relationship) and a "power type". The "power type" is a classification of the operation which is further used to associate a limit of the rate of side reaction losses which is permitted. Exemplary "power types" include normal charge, normal discharge, high power discharge, constant current charge, pulsed current charge, constant voltage charge, etc. The particular manner in which the power types are segregated varies amongst different embodiments.

Typically, a normal charge and a normal discharge are assigned side reaction loss rate limits which are lower than the side reaction loss rate limits associated with a fast charge since the driving force for side reactions is higher during fast charge. Likewise, the side reaction loss rate limits assigned to a "normal" charge are typically lower than the side reaction loss rate limits associated with at least the constant current portion of a fast charge. Side reaction losses are also, however, a function of time spent in performing a charge. Accordingly, at very slow charge rates cumulative side reaction losses can exceed the cumulative side reaction losses at a normal charge. These relationships are captured within the physics-based model. Thus, when time/current demand (or supply) are not critical to the performance of the system in which the battery is located (e.g., a vehicle), impact on the battery life is minimized by controlling the battery based upon the physics-based model.

As discussed above, cell temperature has a significant effect on a cell's operational characteristics as well as on the effect of a particular operation on the life of the cell. Accordingly, the controller 134 executes program instructions stored in the memory 136 to execute the process 170 of FIG. 4 in order to control cell temperature so as to optimize power and energy transfers to and from the battery pack 100/cell 102. The process 170 is described with respect to a single battery cell 102, but in some embodiments is performed for the battery pack 100 as a unit and/or for all battery cells 102 simultaneously or nearly simultaneously.

At block 172, the controller 134 identifies a requested operation. The requested operation may be a requested normal discharge, a requested fast discharge, a requested normal charge, a requested fast charge, etc. Identification of the requested operation in some embodiments is based upon a user input and/or a sensed characteristic. For example, the controller 134 in some embodiments uses the sensor suite 140 to ascertain that power has been made available to charge the battery pack 100. The controller 134 in some embodiments additionally or alternatively receives input from the input/output device 144 as discussed more fully below. In other embodiments, all of the criteria for determining between a normal charge and a fast charge are stored in the memory 136.

Once the controller 134 identifies the requested operation at block 172, the controller 134 obtains a generated target temperature for the requested operation at block 174. As discussed in further detail below, in some embodiments, a table is generated using a physics-based model and stored in the memory 136, the table identifying, for predefined current/voltage/power types, a predetermined target temperature for a number of cell SOC ranges and/or state of health (SOH) ranges. In some embodiments a physics-based model stored within the memory 136 and/or the BMS is used to generate the target temperature based upon present battery conditions in response to a request from the controller 134.

In any event, once the target temperature has been obtained by the controller 134, the controller 134 controls the temperature control system 148 based upon the target temperature so as to heat/cool the cell 102 as necessary to achieve the target temperature. (Block 176). At block 178, the requested operation is performed under the control of the controller 134. In some embodiments, the operation is initiated prior to the cell reaching the desired temperature. By way of example, when the cell temperature is to be raised, the cell in some embodiments is used as a resistor so as to self-heat during the initial stages of a charge or discharge.

At block 180, the controller 134 determines if the identified operation has been completed. If so, then the process returns to block 172 and identifies/waits for a new operation. If there is no power demand on the cell, then the new operation may be, for example, "open cell", "trickle discharge", a subsequent charge segment, etc.

If the operation has not been completed at block 180, then at block 182 the controller 134 determines if a supervening operation has been requested. If so, the process returns to block 172. If there is no supervening request, then the process in some embodiments returns to block 174 and a generated target temperature is again obtained. By repeatedly querying the physics-based model (or data table), the target temperature is modified as battery conditions change during an operation. In some embodiments, a single target temperature is used for the entire operation. Energy savings in certain scenarios can be accomplished with this approach, as sometimes the pack may not need to be thermally controlled.

Figure 5:
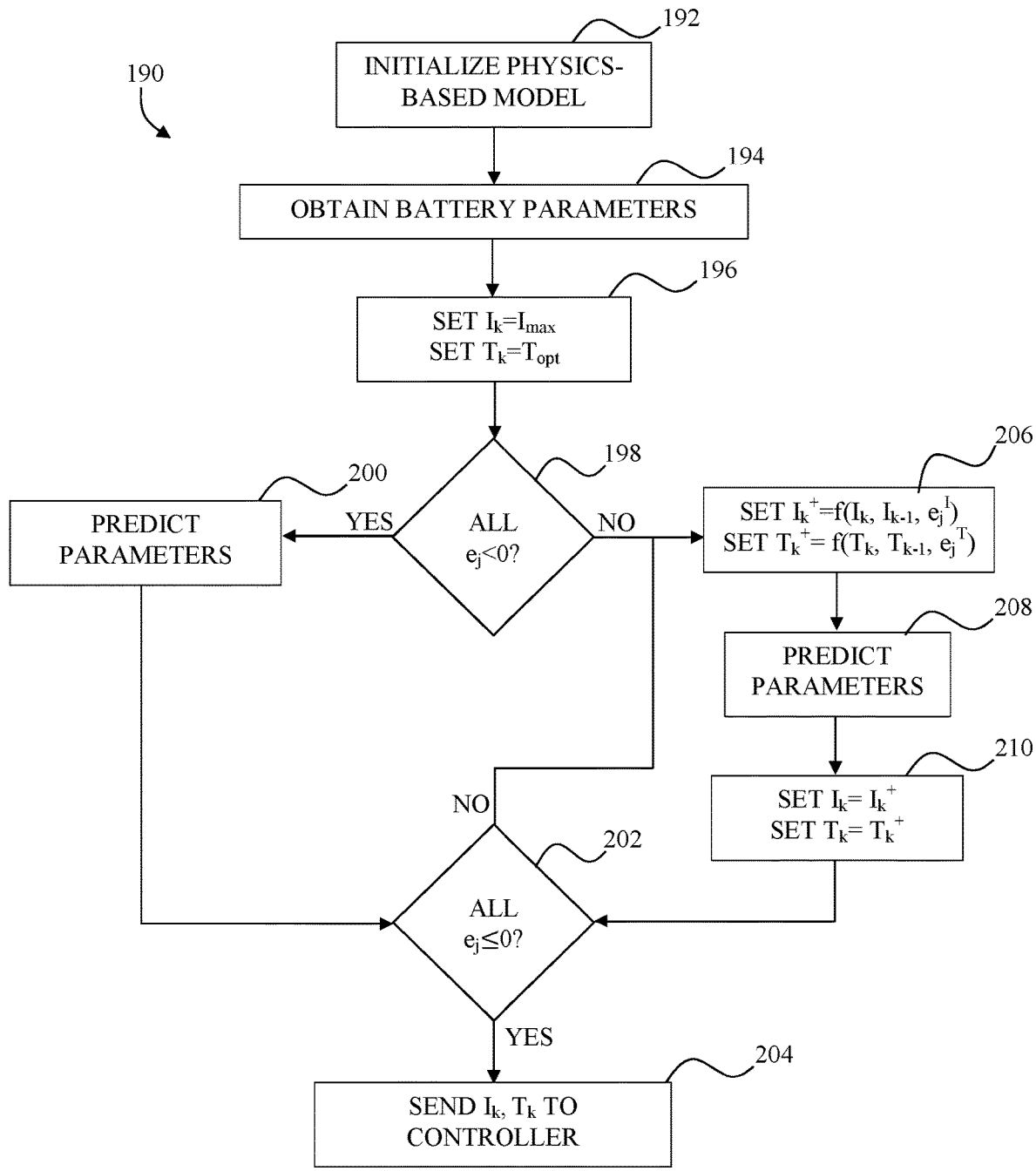
FIG. 5 depicts a process used by the battery management system of FIG. 2 in executing the physics based model.

The generated target temperature which is obtained at block 174 in some embodiments is generated using a process such as the process 190 of FIG. 5 which for this example generates the target temperature for a charging operation, but is modified as appropriate for other processes. The process 190 uses a physics-based model stored within the memory 136. Physics-based model parameters stored within the memory 136 include parameters that correspond to the physical and chemical configuration of the battery pack 100/cells 102, and include constraints ($e_j$) for current, voltage, temperature, and internal battery/cell states that are used to limit the level of current applied to the battery based on the feedback from the present state of the battery and predictions from the physics-based model of the future state of the battery when a given level of current is applied to the battery during the charging process. Accordingly, during the process 170, the controller 134 adjusts the controlled temperature at block 176 as well as current that is applied to the battery for the next time increment at block 178 of the process 170 based upon the process 190.

Returning to FIG. 5, at block 192 the physics-based model stored in the memory 136 is initialized by the controller 134. At block 194 the controller 134 obtains battery parameters using the sensor suite 140 and/or data stored in the memory 136. For generation of real-time target temperatures, battery data including temperature, SOC, SOH, charging current, charging voltage, etc. for each cell or cell block is preferably obtained using the sensor suite 140 and/or data stored in the memory 136. For generation of target temperatures for use in a look-up table, nominal values for battery data in some embodiments are obtained from values stored in the memory 136. Such battery data in different embodiments is generated by previous runs of the physics-based model and/or historical operational data of similar batteries/cells.

The process continues to block 196 and the controller 134 dynamically selects a maximum level of electrical current ($I_{max}$) that is available from the external circuit 120 to be provided as a model target current ($I_k$) to the battery/cell during a time increment ($t_k$) during the charge operation. (For discharge operations the maximum electrical current is the current available from the battery given the present convictions of the cells). The controller 134 further sets a model target temperature ($T_k$) equal to a previously determined optimal temperature ($T_{opt}$) for the particular operation.

The obtained battery parameters are compared to constraint limits stored in the memory 136 to identify any constraints ($e_j$) on the operation. (Block 198). In the example of FIG. 5, an individual constraint is satisfied when a value of $e_j$ is less than zero, the constraint is at a maximum limit when the value of $e_j$ is substantially equal to zero, and the constraint is exceeded when $e_j$ is greater than zero. Accordingly, if no constraints are violated at block 198, The physics-based model is then executed based upon the $I_k$ and $T_k$ (block 200) to generate an estimated value for each of the battery parameters for which an associated $e_j$ exists within the physics-based model.

At block 202 the estimated battery parameters are compared to the stored thresholds. If all of the constraints $e_j$ are less than or equal to zero, the process continues to block 204 and the $I_k$ and $T_k$ are sent to, or obtained by, the controller 134 for use in controlling the charge (see block 174 of process 170) for the next increment.

If at block 198 any of the constraints $e_j$ are equal to or greater than zero, or if at block 202 any of the constraints $e_j$ are greater than zero, the process continues to block 206 and one or more of the $I_k$ and $T_k$ are modified as a function of the $I_k$ and $T_k$, the values of the $I_k$ and $T_k$ for the previous iteration ($I_{k-1}$ and $T_{k-1}$), and the extent to which the current or temperature (or other parameter) exceeded the constraint ($e_j^I$ and $e_j^T$, respectively) to generate a modified $I_k$ and $T_k$ ($I_k^+$ and $T_k^+$, respectively). At block 208 the physics-based model is then executed based upon the $I_k^+$ and $T_k^+$ to generate an estimated value for each of the battery parameters for which an associated $e_j$ exists within the physics-based model and at block 210 the $I_k$ and $T_k$ are set to $I_k^+$ and $T_k^+$, respectively.

The process then returns to block 202 and the estimated battery parameters from block 208 are compared to the stored thresholds. If all of the constraints $e_j$ are less than or equal to zero, the process continues to block 204 and the $I_k$ and $T_k$ are sent to the controller 134 for use in controlling the charge (see block 174 of process 170). If at block 202 any of the constraints $e_j$ are greater than zero, the process returns to block 206 and one or more of the $I_k$ and $T_k$ are again modified as a function of the $I_k$ and $T_k$, the values of the $I_k$ and $T_k$ for the previous iteration ($I_{k-1}$ and $T_{k-1}$), and the extent to which the current or temperature exceeded the constraint ($e_j^I$ and $e_j^T$, respectively) to generate a newly modified $I_k$ and $T_k$ ($I_k^+$ and $T_k^+$, respectively).

Figure 4:
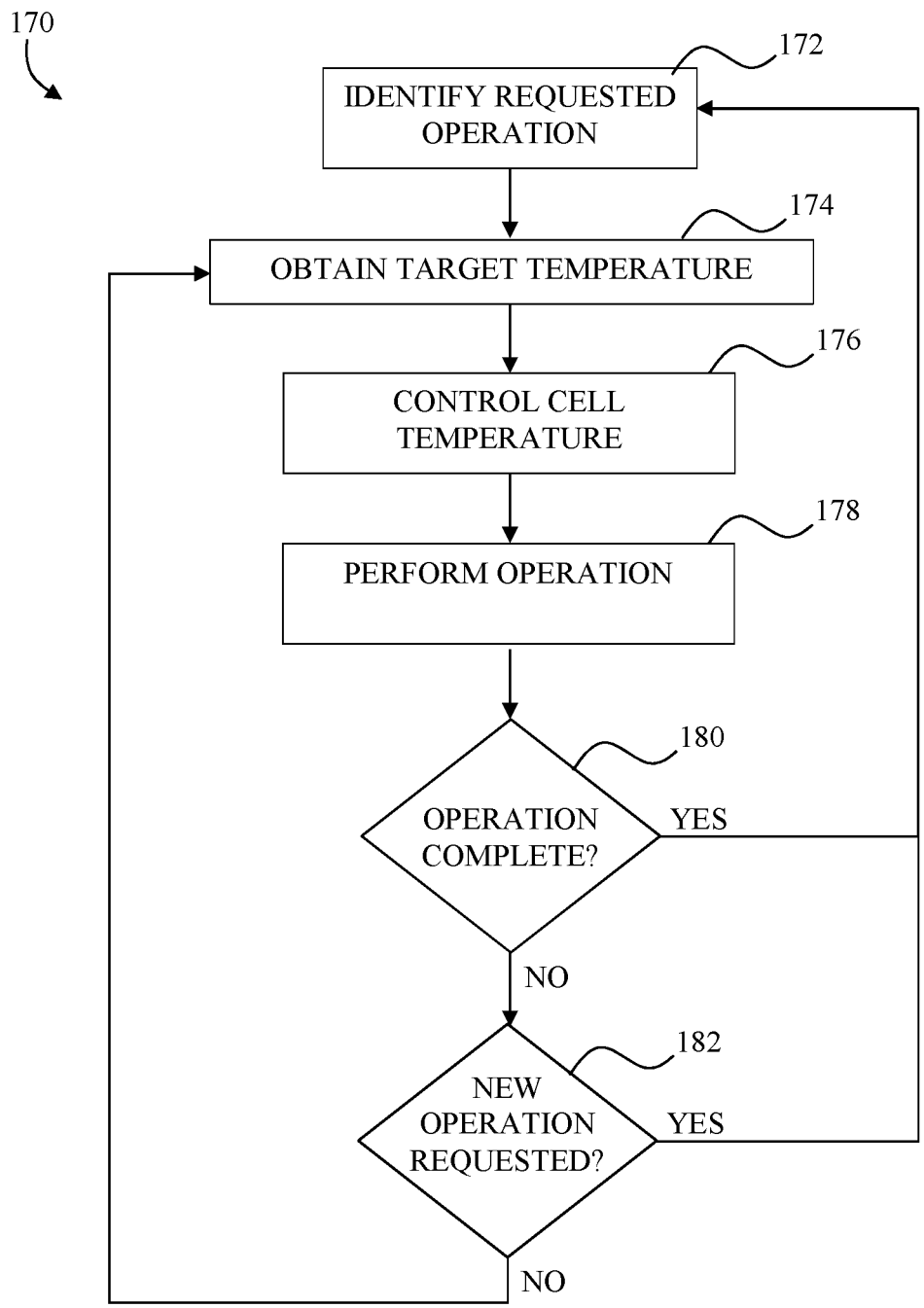
FIG. 4 depicts a process used by the battery management system of FIG. 2 to control the thermal conditions in the battery pack of FIG. 1 using a physics-based model of one or more cells of the battery pack.

The process 190 is performed for each of K time increments during the charging process described in FIG. 4, or other operation, to select a target temperature and/or maximum level of current that also enables the battery operation to satisfy the constraints $e_j$ during each time increment of the operation. The optimization provided by process 170 enables, e.g., recharging of the battery pack 100 in a shorter time than existing CC/CV charging processes, while also reducing or eliminating the accelerated aging or deterioration of the battery by satisfying the selected constraints, such as maximum permitted internal state values, battery current, voltage, and temperature levels.

The process 170 thus uses battery pack/cell temperature as a variable which can be increased until the side reaction loss rate limit associated with the power type (i.e., operation) is reached. Accordingly, the target temperature is the maximum cell temperature which can be targeted by the controller 134 without exceeding the side reaction loss rate limit associated with the power type.

For some embodiments incorporating one or more look-up tables, the process 190 is executed for different SOC and SOH combinations and ranges over the expected lifetime of the cell/battery. The resulting current and temperature parameters ($I_k$ and $T_k$) are then stored in the look-up table for use in the process 170.

As described above, the $T_k$, also referred to herein as the "model target temperature", is initially set to a $T_{opt}$ for the particular operation at block 196. The "optimal" temperature is a function of multiple considerations that in different embodiments include one or more of 1) minimizing cell degradation for the particular operation, 2) minimizing operation time, e.g., charge time, 3) maximum power and energy demand/availability, and 4) maximizing energy efficiency. Thus, while it is generally known that longer charge times can be less energy efficient, there is a point below which efficiency begins to decrease. The physics-based model is used to identify this point so as to maximize efficiency.

The processes 170/190 are further used in some embodiments to parameterize aging models of cells/batteries. By observing many battery packs (e.g., in electric vehicles) over time, changes in the cell parameters and aging behavior can be correlated. For example, loss of cyclable lithium can be correlated with time at different temperatures and voltages, and the optimal temperatures for the packs can be appropriately modified. The system is thus informed both by the physics-based model, and the parameters it collects from machine learning as the pack ages.

As noted above, the identification of a requested operation at block 172 in some embodiments includes user input through the input/output device 144. For example, the user may request a "fast charge" or be queried to select between a "fast charge" and a "normal charge". In one embodiment, since there is some increased aging of the battery pack 100 during a fast charge as compared to a normal charge, the user is allowed to control when such fast charging occurs.

Figure 6:
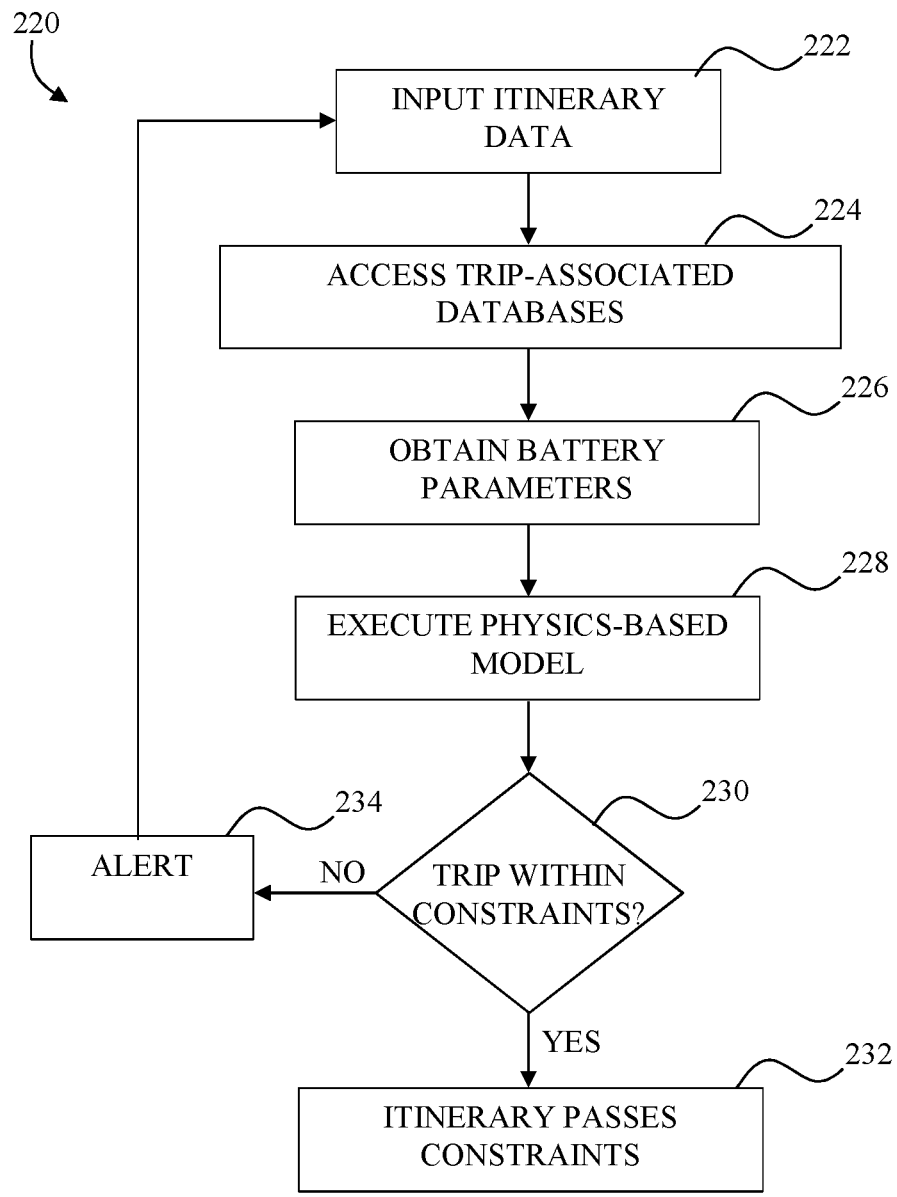
FIG. 6 depicts a process for identifying an intended itinerary and verifying the ability of the system of FIG. 2 to achieve the itinerary without violating battery parameter constraints.

In one embodiment, a user interface of the input/output device 144 allows a user to provide input which is used to identify the requested operation by providing details regarding future operation of the battery pack as described with respect to process 220 of FIG. 6. At block 222, a user inputs itinerary data which in different embodiments includes a mileage to be traveled in a next segment and a time of departure. In one embodiment, the user inputs itinerary data including one or more of a destination, way points, desired arrival times, desired departure times, etc. In any event, the controller 134 then accesses one or more of trip-associated databases as needed to identify one or more of itinerary mileage, mileage between waypoints, elevation changes, speed/speed profile for the trip itinerary, weather, typical traffic patterns, etc. (Block 224). The trip-associated databases in some embodiments are stored within the memory 136. In some embodiments, at least some of the trip-associated databases are located remotely from the vehicle.

At block 226 the controller obtains battery parameters including SOC, SOH, present temperature, etc. using the sensor suite 140 and at block 228, the controller 134 executes the physics based model while incorporating the itinerary data and the battery parameters data. In embodiments wherein the user has identified a number of destinations/waypoints, along with arrival/departure times, the physics-based model is configured to determine the SOC at the end of each segment, and the beginning SOC for the next segment with normal charging between the first segment termination and commencement of the second segment.

The results of the executed model provide an estimate of the system 100 to achieve the input itinerary associated with the itinerary data without violating any constraints (block 230). Constraints in various embodiments in addition to the SOC and temperature constraints include speed constraints, charge time constraints, fast charge constraints, etc. If there are no system constraints, then the process 220 continues to block 232 and informs the user using the input/output device 144 that the system is available for the trip. The thermal profile developed during the process 220 is made available to the user in some embodiments at block 232. The user is further informed of any actions necessary (e.g., charging) to execute the itinerary at block 232.

The data generated at block 232 is further used in some embodiments in identifying a requested operation at block 172 of process 170. By way of example using a single input for purpose of simplicity, when the only input to process 220 is a scheduled departure time, once the constraints at block 230 are passed, at block 232 the start time is passed to the process 170 as a requested warming/cooling operation. The system then determines the most efficient approach for controlling the battery to the optimal temperature at block 176 for a nominal drive at the scheduled departure time such as by keeping the battery warm, allowing some amount of cooling prior to heating, etc.

Returning to FIG. 6, if at block 230 all of the constraints are not met, then the system continues to block 234 and issues an alert using the input/output device 144. In some embodiments, in addition to an alert the controller 134 provides suggestions on how to modify the itinerary to accomplish the desired trip. Such modifications in various embodiments include the execution of one or more fast charges, modification of arrival times to provide for a more efficient vehicular speed, modification of departure times to allow for additional charging, etc. In some embodiments, the constraints include a lower SOC limit for activating the thermal control system. Accordingly, an alert is issued notifying the user that the temperature will not be controlled to the optimal temperature due to low SOC and the thermal control system is placed into an energy saving mode.

The process 220 then returns to block 222 whereat the user modifies the itinerary data. Such modification may include authorization of modifications, including fast charge authorization, modified waypoints, modified arrival/departure times, etc. The process then continues as described above until no constraints are violated at block 230.

Figure 6A:
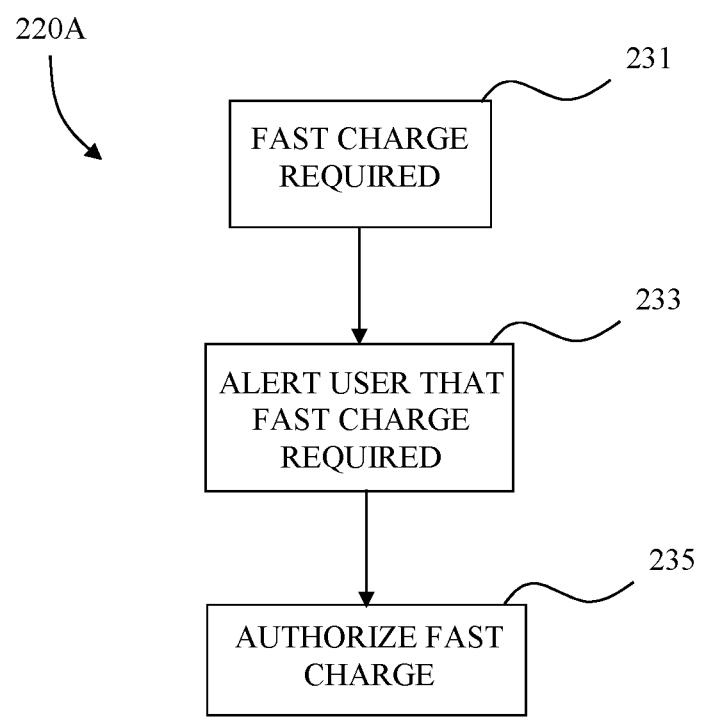
FIG. 6A depicts a process used by the battery management system of FIG. 2 to identify a required charging operation as a fast charging, operation, to alert the user that the fast charging operation is required, and to obtain authorization from the user to perform the fast charge.

The controller 134 in some embodiments thus provides feedback to the user based upon the executed physics-based model and the trip-associated databases. In some embodiments the feedback includes a warning that a fast charge will be required at a particular waypoint in order to have sufficient power for the next trip segment. Thus, as shown in block 231 of the process 220A of FIG. 6A, the controller identifies a required charging operation as a fast charging operation. Then at block 233 the user input/output device is controlled to alert the user that a fast charging operation is required based upon identifying the required charging operation as a fast charging operation. The user then authorizes the fast charge at block 235, or modifies the itinerary such as by extending a stay at a particular location. In some embodiments the controller 134 provides suggestions based upon the physics-based model and the data obtained from the trip-associated databases for itinerary modifications to avoid one or more fast charges during the trip. In some embodiments the controller 134 identifies a number of allowed fast charges remaining and controls the input/output device 144 to display the number of remaining fast charges available.

The controller 134 in some embodiments provides feedback in the form of a warning that even with one or more fast charges, sufficient battery power will not be available for a particular segment. In such instances the controller 13 in some embodiments identifies modifications which would enable completion of the trip. Such modifications include extending time at a particular waypoint, adding a new waypoint, etc.

In some embodiments which are particularly useful in rental vehicles, the controller 134 provides feedback in the form of a warning that the planned itinerary will require one or more fast charges which will incur one or more additional charges.

The process 220 in some embodiments is modified by using input from the controller 134 as "user" input. In some such embodiments, the controller "learns" the driving habits of the user. For example, the controller 134 identifies for particular days the route typically taken by the user, and/or for particular routes the time associated with particular stops. Accordingly, when the vehicle comes to a stop at a known location (e.g., home, work, school, store, etc.) the controller 134 inputs itinerary data at block 222 based upon previous history and executes the process 220. For example, when the vehicle arrives at home on a Sunday night, the controller identifies a departure time on Monday associated with going to a work location. If all conditions pass at block 232, the process in some embodiments further includes an alert to the user that the vehicle will prepare for the predicted event. The user can confirm or override the event. If the event is confirmed, the controller continues to process 170.

Figure 7:
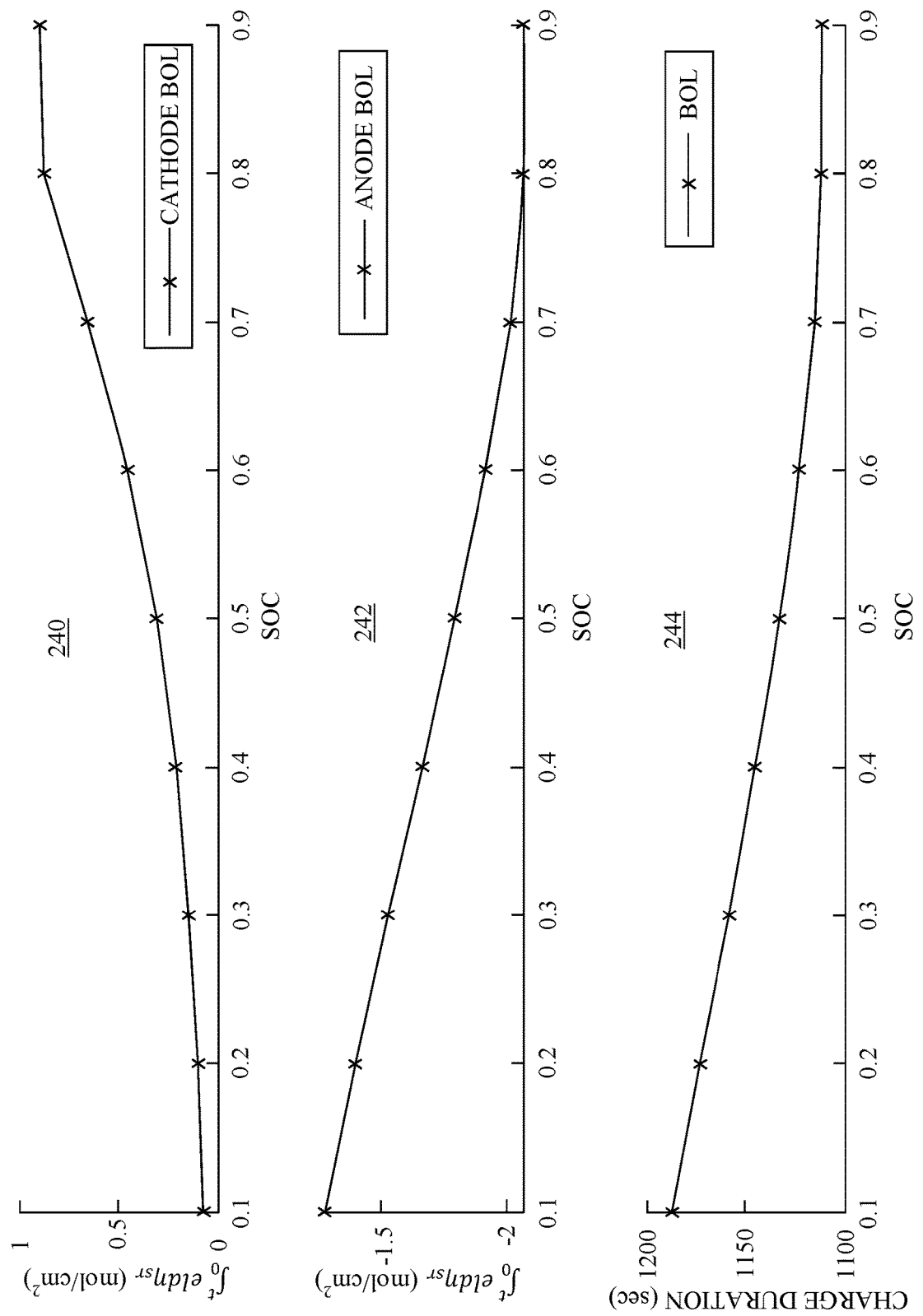
FIG. 7 depicts plots of exemplary simulation results using a physics-based model.

FIG. 7 depicts plots of exemplary simulation results using a physics-based model. During the simulation, a battery was isothermally kept at 40° C. until a specified SOC was reached. At that SOC, the cell was cooled to 20° C. and kept at 20° C. isothermally for the remainder of charge.

Plot 240 of FIG. 7 depicts the total charge lost to side reactions (eld $\eta_{sr}$ in mol/cm$^2$) on the battery cathode versus battery SOC (positive current), plot 242 of FIG. 7 depicts the total charge lost to side reactions (eld $\eta_{sr}$ in mol/cm$^2$) in the anode versus battery SOC (negative current), and plot 244 depicts the charge duration in seconds versus the battery SOC.

Since the total charge lost to side reactions (mol/cm$^2$) in the battery increases the longer the battery is at higher temperature, by shifting to a lower temperature at higher SOC side reaction loss is minimized. FIG. 7 establishes that for an exemplary cell design that charge duration decreases the longer the cell is kept at 40° C. Accordingly, in order to reduce charge time, an acceptable rate of side reactions is established and used to identify a target temperature for the battery (to increase charge rate) until the SOC corresponding with the acceptable rate of side reactions has been reached. The target temperature of the battery/cell is then lowered, e.g., to 20° C., to prevent exceeding the maximum allowed rate of side reaction loss. While 40° C. and 20° C. are the identified temperatures for the example of FIG. 7, other temperatures are used in other embodiments. Moreover, the selected temperatures in some embodiments are not selected solely based upon side reaction losses. In such embodiments, considerations such as heating/cooling efficiency are also used.

The system and methods described above provide more precise detail (informed in real time by the physics based model or look up table) which allows for optimal control of battery temperature, enabling optimal power and energy transfer while minimizing cell aging. In accordance with the principles described above, an optimally controlled battery is heated (or cooled) as needed when high power performance (on charge or discharge) is desired, as long as it will not age the battery beyond an acceptable rate determined based upon a desired battery lifetime, and cooled (or allowed to cool) when high-power transfer is not required or when side reaction loss becomes too great in view of the desired battery lifetime.

Accordingly, when user requires a rapid charge for, e.g., an electric vehicle on a relatively cool day, the battery pack is warmed, actively and/or passively, for the beginning of the charge (low to moderate states of charge) in order to speed up the charge, and then cooled down to reduce the rate of aging at the top of charge (when the driving force for side reactions causing degradation is highest).

The disclosed embodiments provide for adaptively controlled battery temperature using real-time measurements of impedance (internal resistance) and/or predictions of internal states (e.g., individual electrode potentials and overpotentials) from physics-based cell performance models, aging models, and thermal models which are used to predict cell heating due to charge and discharge. The embodiments described above provide for 1) identifying the optimal temperature for minimal battery aging during all use conditions using a physics-based model and/or an empirical model that is informed by field data, and 2) using a control system to move the battery to the optimal temperature using heating and cooling of the battery pack, and/or rapidly cycling current in order to warm the pack (e.g. pulse charge/discharge or alternating current/voltage).

Thus the described embodiments provide the capability of optimally controlling temperature at the points most critical to the underlying physics within the cell. This is a significant improvement over previously known approaches which rely on a more empirical understanding of cell performance which requires extensive testing that is expensive to do and often not sufficient. Applications of the technology described above include using the physics-based model to determine the best temperature for charging as a function of history and state of charge, and then optimally affecting the temperature, including the use of battery current to internally heat the cells (e.g., setting the cell to discharge), varying charge rate intermittently throughout charge, and/or diverting energy to run auxiliary power units such as fans, in order to reach a target temperature at which power/energy transfer is optimized within the constraints of acceptable side reaction losses.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed is:

1. An electrochemical battery system, comprising:
at least one electrochemical cell;
a thermal control system operably connected to the at least one electrochemical cell;
a memory in which a physics-based model of the at least one electrochemical cell is stored and in which program instructions are stored; and
a controller operably connected to the at least one electrochemical cell, the thermal control system and the memory, the controller configured to execute the program instructions to:
identify a first requested charge or discharge operation of the at least one electrochemical cell;
obtain a first generated target temperature, for the at least one electrochemical cell, at which the identified first requested charge or discharge operation is to be performed, the first generated target temperature based on the physics-based model and the identified first requested operation;
control the thermal control system based upon the obtained first generated target temperature to achieve the first generated target temperature of the at least one electrochemical cell for the identified first requested charge or discharge operation; and
control the at least one electrochemical cell during the identified first requested charge or discharge operation with the at least one electrochemical cell at the first generated target temperature; wherein obtaining the first generated target temperature comprises: obtaining at least one cell first parameter of the at least one cell using a sensor suite associated with the at least one cell; setting a model target temperature to a predetermined temperature associated with the first requested operation; setting a model target current to a maximum current associated with the first requested operation, the maximum current based upon a maximum available current; predicting a first future at least one cell second parameter of the at least one cell based upon the obtained at least one cell first parameter using the physics-based model, the model target temperature, and the model target current; and comparing the first future at least one cell second parameter to a first threshold.

2. The electrochemical battery system of claim 1, wherein the controller is further configured to execute the program instructions to:
identify a second requested operation of the at least one electrochemical cell, the second requested operation different from the first requested operation;
obtain a second generated target temperature, for the at least one electrochemical cell, at which the identified second requested operation is to be performed, the second generated target temperature based on the physics-based model and the identified second requested operation, the second generated target temperature different from the first generated target temperature;
control the thermal control system based upon the obtained second generated target temperature to achieve the second generated target temperature of the at least one electrochemical cell for the identified second requested operation; and
control the at least one electrochemical cell during the identified second requested operation with the at least one electrochemical cell at the second generated target temperature.

3. The electrochemical battery system of claim 2, further comprising:
  receiving with the controller at least one itinerary data from a user input/output device;
  identifying with the controller a first required charging operation based upon the at least one itinerary data; and
  setting the first required charging operation as the first requested charge or discharge operation.

4. The electrochemical battery system of claim 3, further comprising:
  identifying with the controller the first required charging operation as a fast charging operation;
  controlling the user input/output device to alert the user that the fast charging operation is required based upon identifying the first required charging operation as the fast charging operation; and
  receiving with the controller authorization from the user to perform the fast charge through the input/output device.

5. The electrochemical battery system of claim 4, further comprising:
  obtaining with the controller mileage data associated with the at least one itinerary data from at least one trip associated database, wherein:
  the at least one itinerary data includes a trip start time; and
  identifying with the controller the first required charging operation as the fast charging operation includes using the obtained mileage data and the trip start time to identify the first required charging operation as the fast charging operation.

6. The electrochemical battery system of claim 1, wherein obtaining the first generated target temperature further comprises:
  generating a modified model target temperature based upon the model target temperature;
  generating a modified model target current based upon the model target current;
  predicting a second future at least one cell second parameter of the at least one cell based upon the obtained at least one cell first parameter using the physics-based model, the modified model target temperature, and the modified model target current;
  setting the model target temperature to the modified model target temperature;
  setting the model target current to the modified model target current; and
  comparing the second future at least one cell second parameter to a second threshold.

7. The electrochemical battery system of claim 6, wherein the controller is further configured to execute the program instructions to:
  identify a second requested operation of the at least one electrochemical cell, the second requested operation different from the first requested charge or discharge operation;
  obtain a second generated target temperature, for the at least one electrochemical cell, at which the identified second requested operation is to be performed, the second generated target temperature based on the physics-based model and the identified second requested operation, the second generated target temperature different from the first generated target temperature;
  control the thermal control system based upon the obtained second generated target temperature to achieve the second generated target temperature of the at least one electrochemical cell for the identified second requested operation; and
  control the at least one electrochemical cell during the identified second requested operation with the at least one electrochemical cell at the second generated target temperature.

8. The electrochemical battery system of claim 7, further comprising:
  receiving with the controller at least one itinerary data from a user input/output device;
  identifying with the controller a first required charging operation based upon the at least one itinerary data; and
  setting the first required charging operation as the first requested charge or discharge operation.

9. The electrochemical battery system of claim 8, further comprising:
  identifying with the controller the first required charging operation as a fast charging operation;
  controlling the user input/output device to alert the user that the fast charging operation is required based upon identifying the first required charging operation as the fast charging operation; and
  receiving with the controller authorization from the user to perform the fast charge through the input/output device.

10. The electrochemical battery system of claim 8, further comprising:
  obtaining with the controller mileage data associated with the at least one itinerary data from at least one trip associated database, wherein:
  the at least one itinerary data includes a trip start time; and
  identifying with the controller the first required charging operation as a fast charging operation includes using the obtained mileage data and the trip start time to identify the first required charging operation as a fast charging operation.

11. A method of operating an electrochemical battery system, comprising:
  identifying with a controller operably connected to at least one electrochemical cell, a thermal control system, and a memory, a first requested charge or discharge operation by executing program instructions stored in the memory;
  obtaining with the controller a first generated target temperature, for the at least one electrochemical cell, at which the identified first requested charge or discharge operation is to be performed, the first generated target temperature based on a physics-based model stored in the memory and the identified first requested operation;
  controlling the thermal control system with the controller based upon the obtained first generated target temperature to achieve the first generated target temperature of the at least one electrochemical cell for the identified first requested charge or discharge operation; and
  controlling the at least one electrochemical cell with the controller during the identified first requested operation with the at least one electrochemical cell at the first generated target temperature; wherein obtaining the first generated target temperature comprises: obtaining at least one cell first parameter of the at least one cell using a sensor suite associated with the at least one cell; setting with the controller a model target temperature to a predetermined temperature associated with the first requested operation; setting with the controller a model target current to a maximum current associated with the first requested operation, the maximum current based upon a maximum available current; predicting a first future at least one cell second parameter of the at least one cell based upon the obtained at least one cell first parameter using the physics-based model, the model target temperature, and the model target current; and comparing with the controller the first future at least one cell second parameter to a first threshold.

12. The method of claim 11, wherein obtaining the first generated target temperature further comprises:
generating a modified model target temperature based upon the model target temperature;
generating a modified model target current based upon the model target current;
predicting a second future at least one cell second parameter of the at least one cell based upon the obtained at least one cell first parameter using the physics-based model, the modified model target temperature, and the modified model target current;
setting the model target temperature to the modified model target temperature;
setting the model target current to the modified model target current; and
comparing the second future at least one cell second parameter to a second threshold.

13. The method of claim 12, further comprising:
identifying with the controller a second requested operation, the second requested operation different from the first requested charge or discharge operation;
obtaining with the controller a second generated target temperature, for the at least one electrochemical cell, at which the identified second requested operation is to be performed, the second generated target temperature based on the physics-based model and the identified second requested operation, the second generated target temperature different from the first generated target temperature; and
controlling with the controller the thermal control system based upon the obtained second generated target temperature while controlling the at least one electrochemical cell based upon the identified second requested operation.

14. The method of claim 13, further comprising:
receiving with the controller at least one itinerary data from a user input/output device;
identifying with the controller a first required charging operation based upon the at least one itinerary data; and
setting the first required charging operation as the first requested operation.

15. The method of claim 11 further comprising:
identifying with the controller a second requested operation, the second requested operation different from the first requested charge or discharge operation;
obtaining with the controller a second generated target temperature, for the at least one electrochemical cell, at which the identified second requested operation is to be performed, the second generated target temperature based on the physics-based model and the identified second requested operation, the second generated target temperature different from the first generated target temperature; and
controlling with the controller the thermal control system based upon the obtained second generated target temperature while controlling the at least one electrochemical cell based upon the identified second requested operation.

16. The method of claim 15, further comprising:
receiving with the controller at least one itinerary data from a user input/output device;
identifying with the controller a first required charging operation based upon the at least one itinerary data; and
setting the first required charging operation as the first requested charge or discharge operation.

17. The method of claim 16, further comprising:
identifying with the controller the first required charging operation as a fast charging operation;
controlling the user input/output device to alert the user that the fast charging operation is required based upon identifying the first required charging operation as the fast charging operation; and
receiving with the controller authorization from the user to perform the fast charge through the input/output device.

18. The method of claim 17, wherein the at least one itinerary data includes a trip start time, the method further comprising:
obtaining with the controller mileage data associated with the at least one itinerary data from at least one trip associated database, and wherein
identifying with the controller the first required charging operation as the fast charging operation includes using the obtained mileage data and the trip start time to identify the first required charging operation as the fast charging operation.

* * * * *